US008642985B2

(12) United States Patent
Chen et al.

(10) Patent No.: US 8,642,985 B2
(45) Date of Patent: Feb. 4, 2014

(54) MEMORY CELL

(75) Inventors: Frederick T. Chen, Zhubei (TW); Heng-Yuan Lee, Zhudong Township, Hsinchu County (TW); Yu-Sheng Chen, Taoyuan (TW)

(73) Assignee: Industrial Technology Research Institute, Chutung, Hsinchu (TW)

( * ) Notice: Subject to any disclaimer, the term of this patent is extended or adjusted under 35 U.S.C. 154(b) by 152 days.

(21) Appl. No.: 13/173,945

(22) Filed: Jun. 30, 2011

(65) Prior Publication Data

US 2013/0001494 A1     Jan. 3, 2013

(51) Int. Cl.
*H01L 45/00*     (2006.01)

(52) U.S. Cl.
USPC ..... 257/1; 257/2; 257/4; 257/5; 257/E45.002; 257/E47.001; 365/148

(58) Field of Classification Search
USPC ............ 257/1, 2, 4, 5, 43, E45.002, E45.003, 257/E47.001; 365/148
See application file for complete search history.

(56) References Cited

U.S. PATENT DOCUMENTS

| 7,796,416 B2 | 9/2010 | Ishihara et al. |
| 2009/0032817 A1 | 2/2009 | Li et al. |
| 2010/0226195 A1 | 9/2010 | Lue |

OTHER PUBLICATIONS

Chopra, "Avalanche-Induced Negative Resistance In Thin Oxide Films", Journal of Applied Physics, vol. 36, No.1, Jan. 1, 1965, pp. 184-187.

Adler, "Switching Phenomena In Thin Films", J. Vac. Sci. Technol., vol. 10, No. 5, Sep./Oct. 1973, pp. 728-738.
Sugimoto et al., "Field-Induced Metal-Insulator Transition And Switching Phenomenon In Correlated Insulators", ar:Xiv:0712. 1390v2 [cond-mat.other], May 30, 2008, pp. 1-5.
Adler et al., "The Mechanism Of Threshold Switching In Amorphous Alloys", Reviews of Modern Physics, vol. 50, No. 2, Apr. 1978, pp. 209-220.
Reiss, "Mixed Ionic-Electronic Conductors-Material Properties And Applications", Elsevier Science B. V., 2002, pp. 1-17.
Okimura et al., "Time-Dependent Characteristics Of Electric Field-Induced Metal-Insulator Transition Of Planer $VO_2/c-Al_2O_3$ Structure," Japanese Journal of Applied Physics, vol. 46, No. 34, 2007, pp. L813-L816.
Ovshinsky, "Reversible Electrical Switching Phenomena In Disordered Structures", Physical Review Letters vol. 21, No. 20, Nov. 11, 1968, pp. 1450-1453.
Ben-Yaacov et al., "Unipolar Space Charge Limited Transport", Berkeley: University of Southern California, 2004, pp. 1-21.

(Continued)

*Primary Examiner* — Whitney T Moore
(74) *Attorney, Agent, or Firm* — Finnegan, Henderson, Farabow, Garrett & Dunner, LLP

(57) ABSTRACT

A memory cell includes a memory element, a current-limiting element electrically coupled to the memory element, and a high-selection-ratio element electrically coupled to the current-limiting element. The memory element is configured to store data as a resistance state. The current-limiting element is a voltage-controlled resistor (VCR) having a resistance that decreases when a voltage applied thereto increases. The high-selection-ratio element has a first resistance that is small when a voltage applied to the memory cell is approximately equal to a selection voltage of the memory cell, and has a second resistance that is substantially larger than the first resistance when the voltage applied to the memory cell is approximately equal to one-half of the selection voltage.

22 Claims, 13 Drawing Sheets

(56) References Cited

OTHER PUBLICATIONS

Chen et al., "Snapback And Overprogramming Modeling Using Finite-Element Electrothermal Simulation", IEEE, 978-1-4244-2411-5/08, 2008, pp. 1-5.

Pergernent at al., "Electroforming And Switching Effects in Yttrium Oxide", Phys. Stat. Sol. (a) 201, No. 7, 2004, pp. 1543-1550.

Fritzsche at al., "Conduction And Switching Phenomena In Covalent Alloy Semiconductors", Journal Of Non-Crystalline Solids 4, 1970, pp. 464-479.

Darwish et al., "Theory Of Switching in MISIM Structures", IEE Proc., vol. 128, Pt. 1, No. 5, Oct. 1981, pp. 165-173.

Homma et al., "New Experiments On Threshold Switching In Chalcogenide And Non-Chalcogenide Alloys", Journal of Non-Crystalline Solids 35 & 36 (1980), pp. 1105-1110.

MEMORY CELL

TECHNOLOGY FIELD

The disclosure relates to memory and, more particularly, to a resistive random access memory cell having a control element.

BACKGROUND

Resistive random access memory (RRAM) is a new non-volatile type memory based on dielectric materials. The memory element in an RRAM cell is a resistive switching device. For a resistive switching device, for example, if a sufficiently high voltage of one polarity is applied, the resistive switching device can switch (SET) to a low-resistance state. On the other hand, if a sufficiently high voltage of the opposite polarity is applied, the resistive switching device can switch (RESET) to a high-resistance state. The different resistance states of the resistive switching device can be used to represent "0" and "1," respectively.

Due to its high-speed random access, low power consumption, high cyclability, high retention at high temperature, and scalability to 10 nm and below, RRAM has become a promising non-volatile memory technology to potentially replace NOR and NAND flash memories and dynamic random access memory (DRAM).

In order for an RRAM to operate properly, a controlling element having variable resistance needs to be serially connected to the resistive switching device, so that a current passing through the RRAM cell can be regulated separately for different operations, such as READ, SET, or RESET. Due to the need for operation voltages in opposite polarities, a single p-n junction or a single Schottky diode is not suitable for use as the controlling element. A conventional RRAM cell typically includes a resistive switching device and a transistor, such as a field effect transistor (FET), as the variable resistance controlling element. The resistance of an FET between its source and drain can be controlled by changing the voltage applied to the gate of the FET. Thus, if a resistive switching device is electrically connected to the source or drain of the FET, the resistance serially connected to the resistive switching device can be regulated by controlling the voltage applied to the gate of the FET. However, since the FET is a planar device, it cannot be vertically integrated with the resistive switching device. Therefore, a conventional RRAM employing the FET as the variable resistance controlling element may have a large cell size that makes high storage density and high capacity difficult to achieve.

Accordingly, there is a need for an improved RRAM.

SUMMARY

In accordance with the disclosure, there is provided a memory cell comprising a memory element, a high-selection-ratio element electrically coupled to the memory element, and a current-limiting element electrically coupled to the high-selection-ratio element. The memory element is configured to store data as a resistance state. The current-limiting element is a voltage-controlled resistor (VCR) having a resistance that decreases when a voltage applied thereto increases. The high-selection-ratio element has a first resistance when a voltage applied to the memory cell is approximately equal to a selection voltage of the memory cell, and has a second resistance that is substantially larger than the first resistance when the voltage applied to the memory cell is approximately equal to one-half of the selection voltage.

Also in accordance with the disclosure, there is provided a memory cell controlling device comprising a selection element that has a first resistance at a sufficiently high voltage and a second resistance that is substantially larger than the first resistance at a sufficiently low voltage, and a voltage-controlled resistor (VCR) electrically coupled to the selection element.

Further in accordance with the disclosure, there is provided a three-dimensional memory array, comprising a plurality of planes of horizontal conducting lines stacked vertically, each plane including an array of the horizontal conducting lines aligned in a first direction. Each of the horizontal conducting lines includes a metal line and a voltage-controlled resistor (VCR) material formed on at least one sidewall of the metal line. The memory array further includes a plurality of vertical conducting lines. Respective sides of each of the vertical conducting lines contact adjacent ones of the horizontal conducting lines in each of the plurality of planes. The vertical conducting lines each comprises a resistance-changing memory material and an S-shaped negative differential resistance (SSNDR) material. The resistance-changing memory material and the SSNDR material are electrically coupled to the VCR and to each other. The memory array also includes a plurality of bit lines, aligned in a second direction orthogonal to the first direction, and electrically connected to the vertical conducting lines at tops of the vertical conducting lines.

Further in accordance with the disclosure, there is provided a three-dimensional memory array comprising a plurality of planes of horizontal conducting lines stacked vertically, each plane including an array of the horizontal conducting lines aligned in a first direction. Each of the horizontal conducting lines includes an S-shaped negative differential resistance (SSNDR) material, a metal line formed on the SSNDR material, and a voltage-controlled resistor (VCR) material formed on at least one sidewall of the SSNDR material. The memory array further includes a plurality of vertical conducting lines. Respective sides of each of the vertical conducting lines contact adjacent ones of the horizontal conducting lines in each of the plurality of planes. The vertical conducting lines each comprises a resistance-changing memory material. The memory array also includes a plurality of bit lines, aligned in a second direction orthogonal to the first direction and electrically connected to the vertical conducting lines at tops of the vertical conducting lines.

Further in accordance with the disclosure, there is provided a three-dimensional memory array comprising a plurality of planes of horizontal conducting lines stacked vertically, each plane including an array of the horizontal conducting lines aligned in a first direction. Each of the horizontal conducting lines includes a metal line and a voltage-controlled resistor (VCR) material formed on at least one sidewall of the metal line. The memory array further includes a plurality of vertical conducting lines. Respective sides of each of the vertical conducting lines contact adjacent ones of the horizontal conducting lines in each of the plurality of planes. The vertical conducting lines each comprises a resistance-changing memory material. The memory array also includes a plurality of bit lines, aligned in a second direction orthogonal to the first direction and electrically connected to the vertical conducting lines at tops of the vertical conducting lines.

Features and advantages consistent with the disclosure will be set forth in part in the description which follows, and in part will be obvious from the description, or may be learned by practice of the disclosure. Such features and advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

Embodiments consistent with the disclosure include a memory cell and a memory cell controlling element.

Hereinafter, embodiments consistent with the disclosure will be described with reference to drawings. Wherever possible, the same reference numbers will be used throughout the drawings to refer to the same or like parts.

Figure 1:
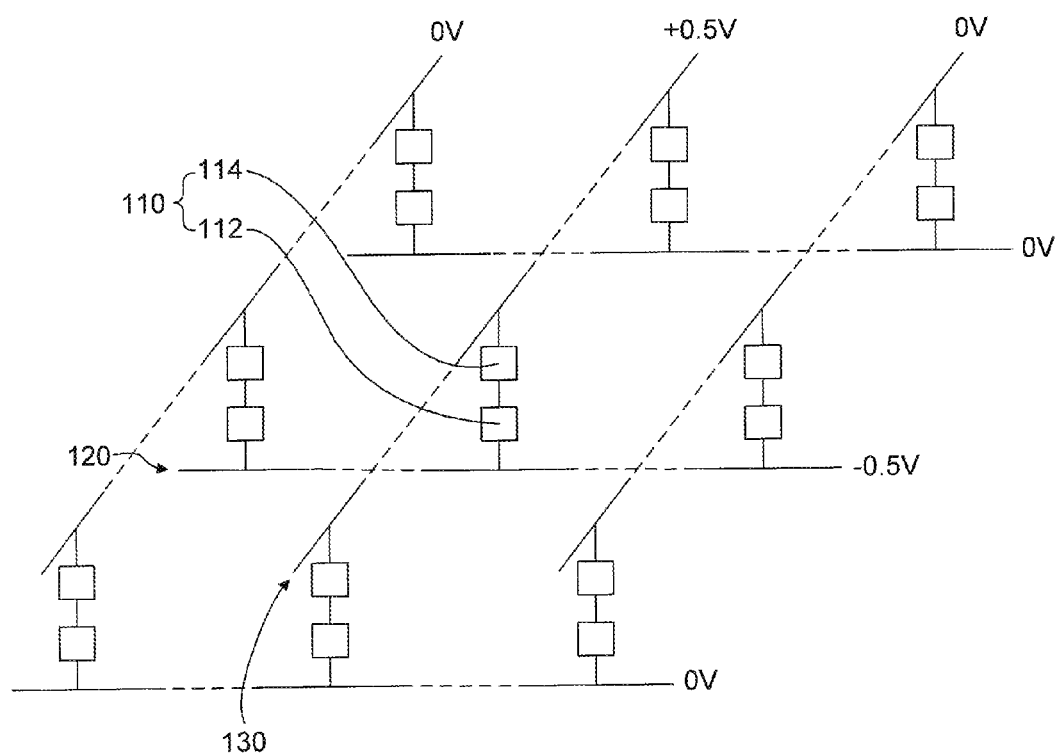
FIG. 1 is a schematic view showing a memory cell array according to an exemplary embodiment.

FIG. 1 schematically shows a memory cell array 100 according to an exemplary embodiment. The memory cell array 100 includes M×N memory cells 110, where M is the number of rows in the array and N is the number of columns. The memory cells in each of the M rows are connected to a word line 120, and the memory cells in each of the N columns are connected to a bit line 130. Each of the memory cells 110 has an address, such as (i, j), where i, j are integers, indicating that the memory cell 110 is connected to the i-th word line 120 and the j-th bit line 130.

The memory cell 110 includes a memory element 112, such as a resistive switching device, and a controlling element 114. The controlling element 114 may be turned on, which corresponds to a condition in which the resistance of the controlling element 114 is significantly reduced, by applying a voltage larger than a threshold voltage across its two terminals. For an ideal controlling element, when the applied voltage is smaller than the threshold voltage, no current should pass through, i.e., the resistance of the ideal controlling element should be infinite when the applied voltage is smaller than the threshold voltage. However, in practice, a small current may flow even if the applied voltage is smaller than the threshold voltage of a controlling element. That is, a real controlling element always has a finite resistance, although such finite resistance may be very large when the applied voltage is smaller than its threshold voltage.

In order to select a memory cell 110 having an address (i, j) (hereinafter called the selected memory cell), a negative voltage may be applied to the i-th word line 120, and a positive voltage may be applied to the j-th bit line 130. As a result, the voltage across the selected memory cell is the difference between the positive voltage and the negative voltage. During selection of the selected memory cell, no voltage is applied to the other word and bit lines, i.e., they may be connected to ground. This operation scheme may allow zero voltage to be applied to the majority of unselected memory cells that are neither connected to the i-th word line 120 nor connected to the j-th bit line 130.

While the absolute value of each of the positive and negative voltages is smaller than the threshold voltage of the controlling element 114, the voltage across the controlling element 114 in the selected memory cell (which may be smaller than the total applied voltage across the selected memory cell because part of the total applied voltage may be apportioned across the memory element 112) is larger than the threshold voltage of the controlling element 114. This is the case even though the total voltage applied across selected memory cell 110 is apportioned across each of the memory element 112 and the controlling element 114. Accordingly, the controlling element 114 is turned on. The voltage across the memory cell 110 having a value large enough to turn on the controlling element 114 is set as a selection voltage. For example, the threshold voltage of the controlling element may be larger than 0.5 V but smaller than 1 V. Therefore, a negative voltage of about −0.5 V may be applied to the i-th word line 120, and a positive voltage of about +0.5 V may be applied to the j-th bit line 130, as indicated in FIG. 1.

When a negative voltage of about −0.5 V and a positive voltage of about +0.5 V are applied to the i-th word line 120 and j-th bit line 130, respectively, a voltage of about 0.5 V may be applied to each of the rest of the memory cells 110 connected to the i-th word line 120 and each of the rest of the memory cells 110 connected to the j-th bit line 130, as shown in FIG. 1. These memory cells are referred to as "half-selected" memory cells. As mentioned above, although this voltage may not be large enough to turn on the controlling element 114, a small current may still exist in these half-selected memory cells, forming N−1 possible parasitic paths between ground and the i-th word line 120, and M−1 possible parasitic paths between the j-th bit line 130 and ground. Although the current in each of the M+N−2 parasitic paths may be very small, the total amount of current in all of the parasitic paths may become comparable to the current passing through the selected memory cell, since M and N can both be very large.

For the memory cell array 100 to work properly, the current passing through the selected memory cell should be significantly larger than the total current passing through all of the half-selected memory cells. Since the number of half-selected memory cells can be very large, the current passing through one of the memory cells 110 when the applied voltage approximately equals the selection voltage, should be significantly larger than the current passing through that cell when the applied voltage approximately equals about one-half of the selection voltage. The ratio between the currents in these two states is referred to herein as a selection ratio. The selection ratio of the memory cell 110 is inversely related to a resistance ratio $R_{ON}/R_{1/2}$, where $R_{ON}$ is the resistance of the memory cell 110 when a voltage approximately equaling the selection voltage is applied, and $R_{1/2}$ is the resistance of the memory cell 110 when a voltage approximately equaling one-half of the selection voltage is applied. The lower the resistance ratio $R_{ON}/R_{1/2}$ is, the higher is the selection ratio.

In one exemplary embodiment, it is assumed that the ratio between the current passing through the selected memory cell and the total current passing through all of the half-selected memory cells is required to be larger than 10. To achieve that current ratio, the required resistance ratio between $R_{ON}$ and $R_{1/2}$ may be expressed as follows:

$$R_{ON}/R_{1/2} < 0.1(M+N-2)/[(M-1)(N-1)].$$

Assuming M=N>>1, then the above expression may be simplified as:

$$R_{ON}/R_{1/2} < 0.2 \times N^{-1}.$$

For a memory cell array having a 10 Gb storage capacity, that is, $N \approx 10^5$, this requires that $R_{ON}/R_{1/2} < 2 \times 10^{-6}$. A larger current ratio would require smaller $R_{ON}/R_{1/2}$.

Figure 2:
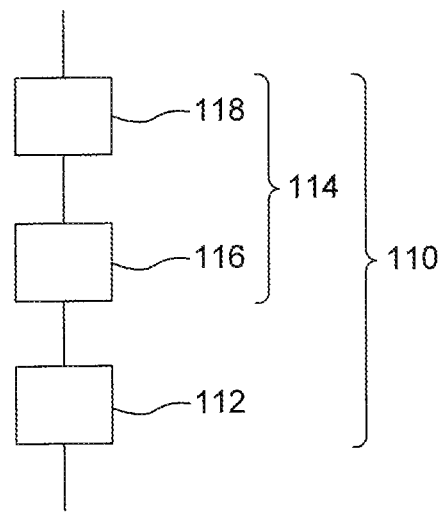
FIG. 2 is a schematic enlarged view showing a memory cell according to an exemplary embodiment.

FIG. 2 schematically shows an enlarged view of the memory cell 110 consistent with an exemplary embodiment of the disclosure. The memory cell 110 includes the memory element 112 and the controlling element 114 electrically connected in series with each other. In some embodiments, the memory element 112 may be a resistive switching device, which may exhibit different resistance states under different conditions. A voltage or current may be applied to the resistive switching device to cause it to enter different resistance states. For example, the resistive switching device may switch between a high-resistance state and a low-resistance state when different voltages are applied, and maintain its state after the voltages are removed. The different states of the resistive switching device can be used to represent binary values of "1" and "0," respectively.

The controlling element 114 includes a high-selection-ratio element 116 and a current-limiting element 118 electrically connected in series with each other, as shown in FIG. 2. The high-selection-ratio element 116 has a variable resistance depending on a voltage applied thereto. In some embodiments, when the voltage applied to the memory cell 110 approximately equals the selection voltage of the memory cell 110, that is, when the voltage applied to the memory cell 110 is sufficiently high, the high-selection-ratio element 116 has a first resistance R1. When the voltage applied to the memory cell 110 approximately equals about one-half of the selection voltage of the memory cell 110, that is, when the voltage applied to the memory cell 110 is sufficiently low, the high-selection-element 116 has a second resistance R2. The second resistance R2 is substantially larger than the first resistance R1. In some embodiments, the ratio of the second resistance R2 to the first resistance R1 is larger than about $5 \times 10^5$. In addition, the second resistance R2 of the high-selection-ratio element 116 is also much larger than the resistance of the memory element 112 in a high-resistance state. In some embodiments, the ratio of the second resistance R2 of the high-selection-ratio element 116 to the resistance of the memory element 112 in a high-resistance state may be larger than about $10^6$.

Figure 3:
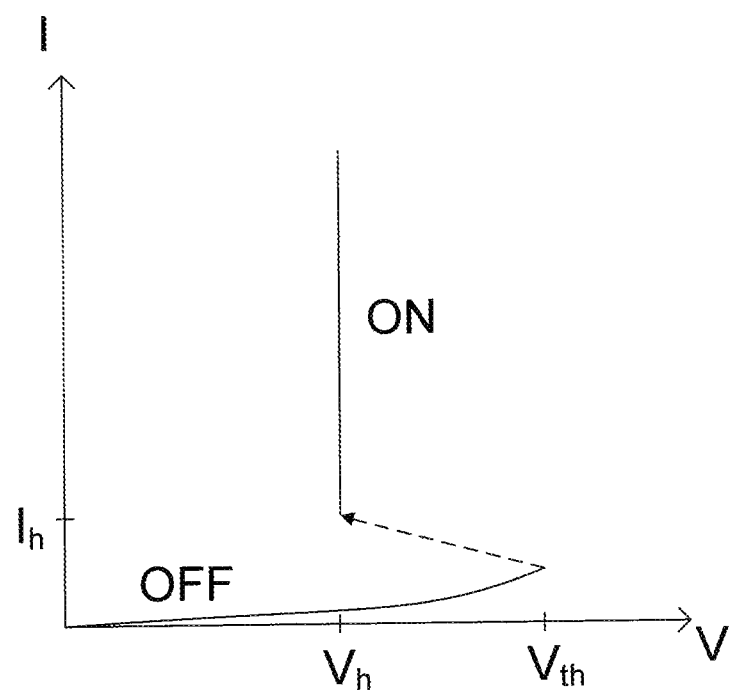
FIG. 3 is a schematic view showing an I-V curve for an S-shaped negative differential resistance (SSNDR) characteristic device.

In some embodiments, the high-selection-ratio element 116 is provided as a device with an S-shaped negative differential resistance (SSNDR) characteristic. Such a device exhibits a "snapback" (sudden voltage drop) phenomenon in its current-voltage (I-V) curve, as schematically shown in FIG. 3. In some embodiments, the SSNDR device may have a structure comprising a leaky tunneling barrier layer and a locally variable charge-density layer (such as a semiconductor or charge-trapping layer). The leaky tunneling barrier layer may be less resistive than the variable charge-density layer at low voltages, but may limit transmission of charge carriers at higher voltages. The variable charge-density layer may have defects or dopants that can trap charges. With the help of the tunneling barrier layer, more mobile charges may be accumulated in the variable charge-density layer, with the result that the carrier density in this layer increases significantly. Localized conduction paths, known as filaments, may appear. In some embodiments, the SSNDR device may include an ovonic threshold switch (OTS) or a material that may undergo a metal-insulator transition. Avalanche carrier multiplication may be responsible for a significant increase in current density. The higher current density may lead to a destructive, irreversible switching, due to thermally induced material changes. Such thermal effects may be alleviated by reducing the thickness of the SSNDR device accordingly. Referring to FIG. 3, when the voltage applied to the SSNDR device increases from 0, the current passing therethrough may first increase gradually while remaining at a very low level, indicating that the resistance in this state is very large. While such very low current passes through, the SSNDR device is in an "OFF" state.

When the voltage applied to the SSNDR device increases beyond a threshold voltage $V_{th}$ indicated in FIG. 3, the resistance of the SSNDR device suddenly drops to a very small value. As a result, the current passing through the SSNDR device increases sharply. While such increased current flows through the SSNDR device, the device is in an "ON" state. While the SSNDR device is in the "ON" state, the voltage across the SSNDR device is clamped at a fixed value $V_h$. The balance of the applied voltage is apportioned across any resistance connected in series to the SSNDR device. For example, in the exemplary embodiment shown in FIG. 2, such resistance consists of the respective resistances of the memory element 112 and the current-limiting element 118. The amount of current passing through the SSNDR device is also determined by such resistance.

Therefore, when an SSNDR device is used as the high-selection-ratio element 116, a current-limiting element 118 is needed to be serially connected to the high-selection-ratio element 116 to limit the current passing therethrough, as well as through the memory element 112, to prevent the memory element 112 from being damaged. The current-limiting element 118 may be provided as a voltage-controlled resistor (VCR) having a resistance that decreases when the voltage applied thereto increases.

The current-limiting element 118 is not a resistor with fixed resistance value. A fixed resistance value leads to comparable power consumptions in the memory element 112 and in the current-limiting element 118 during a RESET operation. Furthermore, in many cases, the resistance of the memory element 112 itself decreases with increasing applied voltage. As such, the current-limiting element 118 would have a resistance that decreases even faster with increasing applied voltage, because the voltage drop on the memory element 112 may need to be higher than that on the current-limiting element 118 during the RESET operation. Otherwise, if the current-limiting element 118 has a fixed resistance, as the total voltage applied to both elements increases, the voltage applied to the current-limiting element 118 increases even more. For example, the memory element 112 before RESET may have an ohmic-type resistance, that is, the current passing through the memory element 112 is proportional to the voltage applied thereto (I∝V). On the other hand, the current-limiting element 118 may have a resistance that is inversely proportional to the voltage, for example, the current passing through the current-limiting element 118 is proportional to the square of the voltage applied thereto (I∝V$^2$). However, although the resistance of the current-limiting element 118 needs to be lower than that of the memory element 112 during the RESET operation, for a SET operation, the resistance of the current-limiting element 118 should be high enough to prevent breakdown of or irreversible damage to the memory element 112.

In some embodiments, the current-limiting element 118 may be selected so that when a voltage equaling the selection voltage is applied to the memory cell 110, the current passing through the memory cell 110 has a density smaller than about 10 MA/cm$^2$.

After the SSNDR device is turned on, it will stay in the "ON" state as long as the current passing therethrough is kept larger than a value called holding current. Therefore, the current-limiting element 118 may also be selected to allow the current passing through the memory cell 110 to be larger than the holding current of the high-selection-ratio element 116 when the selection voltage is applied to the memory cell 110. In some embodiments, the holding current of the high-selection-ratio element 116 may have a density of about 10 kA/cm$^2$.

While FIG. 2 illustrates an exemplary memory cell 110 consistent with embodiments of the disclosure, the connecting order of the elements may be different from that shown in FIG. 2. For example, the current-limiting element 118 may be connected between the memory element 112 and the high-selection-ratio element 116.

Figure 4:
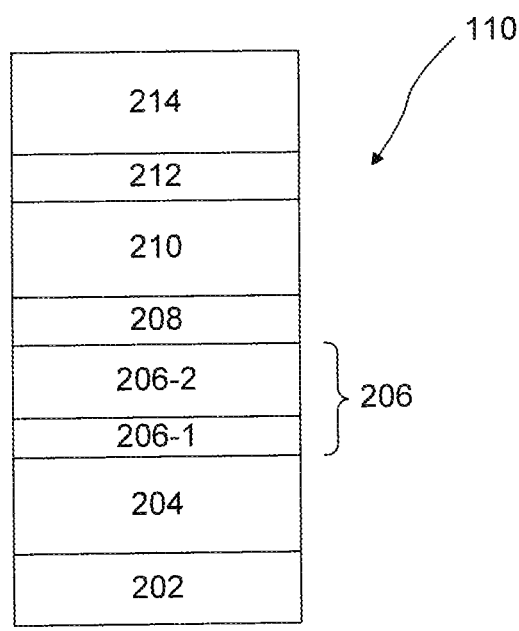
FIG. 4 is a schematic view showing a structure of a memory cell according to an exemplary embodiment.

FIG. 4 schematically shows a structure of the memory cell 110 consistent with an exemplary embodiment of the disclosure. As shown in FIG. 4, the memory cell 110 includes a bottom electrode layer 202, a memory layer 204, a lower intermediate electrode layer 206, an SSNDR layer 208, an upper intermediate electrode layer 210, a non-metal layer 212, and a top electrode layer 214. The lower and upper intermediate electrode layers 206 and 210 may be shared by the elements on both sides thereof. However, to simplify description, in this disclosure, the memory element 112 is considered to include the bottom electrode layer 202, the memory layer 204, and the lower intermediate electrode layer 206, the high-selection-ratio element 116 is considered to include the SSNDR layer 208, and the current-limiting element 118 is considered to include the upper intermediate electrode layer 210, the non-metal layer 212, and the top electrode layer 214, as shown in FIG. 4. It is to be understood that the high-selection-ratio element 116 may also include a portion of the lower intermediate electrode layer 206 and a portion of the upper intermediate electrode layer 210.

Consistent with embodiments of the disclosure, the memory layer 204 comprises a metal oxide material having resistive switching effect, such as a HfO$_x$, where 0<x≤2. In some embodiments, x may be equal to 2.

As explained above, consistent with embodiments of the disclosure, the SSNDR layer 208 may comprise an OTS. In some embodiments, the OTS may comprise a chalcogenide material including, for example, GeS, GeSe, GeSe$_2$, AsTe, GeTe, GeAsTe, GeAsSeTe, TeAsSiGe, or GeAsSeTeSi of various stoichiometries, or any combination thereof. In some embodiments, the chalcogenide material may also include additives, such as N, P, or S. In such embodiments, assuming an exemplary construction of the SSNDR layer 208 having a cylindrical shape with a thickness, i.e., cylindrical height, of about 10 nm and a diameter in the horizontal cross-section of about 65 nm, the resistance of the SSNDR layer 208 in the "OFF" state may be as high as about 3×10$^{12}$ ohm. The OTS may also be replaced by a thick self-heating semiconductor layer (i.e., a thermistor) with a fairly low thermal conductivity and a resistivity of the form $\rho=\rho_0 \exp(E_a/kT)$, with k being the Boltzmann constant (8.6 e-5 eV/K) and $E_a$ being typically about 1-2 eV (see H. Fritzsche and S. R. Ovshinsky, J. Non-crystalline Solids 4, 464-479 (1970) and F. Chen et al., NVMTS 2008 (2008)).

In some embodiments, the SSNDR layer 208 may comprise a multilayer structure, including at least one leaky tunneling barrier layer and a variable charge-density layer, such as a semiconductor or charge-trapping layer. The purpose of the tunneling barrier layer is to let charge density build up as current flows within the variable charge-density layer at the interface with the tunneling barrier layer, until at some point, the variable charge-density layer becomes conducting due to sufficiently high charge carrier density. Consequently, the voltage across this layer drops, and the current density increases several orders of magnitude. To achieve symmetric I-V characteristics, the variable charge-density layer may be sandwiched between two tunneling barrier layers for the same purpose. For example, the SSNDR layer 208 may have an insulator-semiconductor-insulator (ISI) structure.

In some embodiments, the SSNDR layer 208 may comprise a material that undergoes a metal-insulator transition. The transition leads to filament generation in the ON state. The SSNDR layer may also be a thin oxide layer that supports avalanche carrier generation. To ensure that the SSNDR switching is reversible, the avalanche current density should be low enough not to cause a thermal transformation of the material of the SSNDR layer. Therefore, the SSNDR layer may be as thin as possible but should at the same time be thick enough to support avalanche generation.

As mentioned above, the current-limiting element 118, which is provided as a VCR, is considered to include the upper intermediate electrode layer 210, the non-metal layer 212, and the top electrode layer 214. In some embodiments, the non-metal layer 212 may be a semiconductor layer, such as a Si layer. In these embodiments, the current-limiting element 118 is a metal-semiconductor-metal diode corresponding to the upper intermediate electrode layer 210, the non-metal layer 212, and the top electrode layer 214. In other embodiments, the non-metal layer 212 may be an oxide layer, such as a TiO$_x$ layer, where 0<x≤2. In these embodiments, the current-limiting element 118 is a metal-insulator-metal diode corresponding to the upper intermediate electrode layer 210, the non-metal layer 212, and the top electrode layer 214.

Both the metal-semiconductor-metal diode and the metal-insulator-metal diode have variable resistance controlled by the voltage applied thereto. Compared to the metal-semiconductor-metal diode, the metal-insulator-metal diode can provide much higher current density. For example, the metal-semiconductor-metal diode may provide a current density of smaller than 1000 A/cm$^2$, while the metal-insulator-metal diode consistent with embodiments of the disclosure can provide a current density of as high as 10$^6$ A/cm$^2$. Moreover, fabrication of a metal-semiconductor-metal diode may require a temperature of higher than 500° C.

In an exemplary embodiment, the non-metal layer 212 may be a TiO$_2$ layer or any dielectric or semiconductor layer supporting space charge (i.e., injected charge) conduction, that is, the current passing through the non-metal layer 212 is proportional to the square of the voltage applied thereto and inversely proportional to the cube of the thickness thereof (current ∝ (voltage)$^2$/(thickness)$^3$). Alternatively, the non-metal layer 212 may be a self-heating semiconductor layer, i.e., a thermistor, or may be a mixed ionic-electronic conductor (MIEC). In some embodiments, a thickness of the non-metal layer 212 may be about 10 nm or less.

Consistent with embodiments of the disclosure, the bottom electrode layer 202, the lower intermediate electrode layer 206, the upper intermediate electrode layer 210, and the top electrode layer 214 may be made of a metal material, such as TiN. In some embodiments, the lower intermediate electrode layer 206 may be a composite layer formed of at least two layers 206-1 and 206-2, as shown in FIG. 4. In some embodiments, the lower layer 206-1 may be a reactive layer, such as a Ti layer, facilitating generation of oxygen vacancies, and the upper layer 206-2 may be a relatively inert barrier layer, such as a TiN layer. In some embodiments, thicknesses of the upper intermediate electrode layer 210 and the top electrode layer 214 may be up to 50 nm. In some embodiments, the upper intermediate electrode layer 210 and the top electrode layer 214 may each form a Schottky barrier with the non-metal layer 212. In some embodiments these Schottky barriers may overlap, leading to punchthrough and forming a common depletion or space charge region. In some embodiments, the materials and thicknesses of the upper intermediate electrode layer 210, the non-metal layer 212, and the top electrode layer 214 may be selected so that no Schottky barrier is formed while the combination of such layers may still have a voltage-controlled resistance, and thus function properly as a current-limiting element.

While FIG. 4 illustrates an exemplary structure of the memory cell 110 consistent with embodiments of the disclosure, the stacking order of the layers may be different from that shown in FIG. 4. In addition, in some embodiments, some of the electrode layers 202, 206, 210, and 214 may be omitted. For example, the SSNDR layer 208 may be formed in direct contact with the memory layer 204, without the lower intermediate electrode layer formed therebetween. As another example, the non-metal layer 212 may be formed in direct contact with the SSNDR layer 208. Alternatively, the non-metal layer 212 may also be formed on, and in direct contact with, the memory layer 204.

Figure 5A:
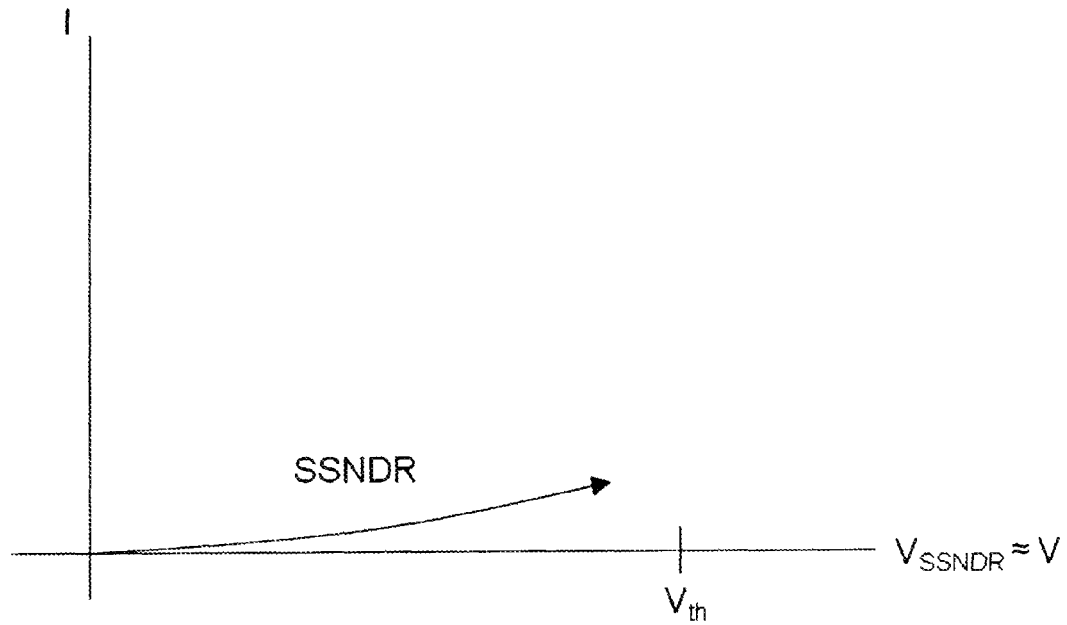
FIGS. 5(A)-5(E) are schematic views showing I-V curves for various components of a memory cell during different operations according to an exemplary embodiment.

FIGS. 5(A)-5(E) schematically show the operation of a memory cell consistent with an exemplary embodiment of the disclosure. The memory cell 110 may include the memory element 112 provided as a resistive switching device, the high-selection-ratio element 116 provided as an SSNDR device, and the current-limiting element 118 provided as a VCR such as a diode having a metal-thermistor-metal structure, a metal[space-charge-limited-conductor]-metal structure, or a metal-MIEC-metal structure. In FIGS. 5(A)-5(E), V represents the total voltage applied across the memory cell, $V_{SSNDR}$ represents the voltage applied to the SSNDR device, $V_{th}$ and $V_h$ represent the threshold voltage and the holding voltage of the SSNDR device, respectively, $I_h$ represents the holding current of the SSNDR device, $V_D$ represents the voltage applied to the diode of current-limiting element 118, $V_{RS}$ represents the voltage applied to the resistive switching device provided as the memory element 112, and $V_f$ represents the forming voltage of the resistive switching device. The curve in FIG. 5(A) represents the I-V curve for the SSNDR device. In FIGS. 5(B)-5(E), the three curves from bottom to top represent the I-V curves for the SSNDR device, the diode and resistive switching device (labeled D+R in these figures), and the resistive switching device alone (labeled RS in these figures), respectively.

Figure 5B:
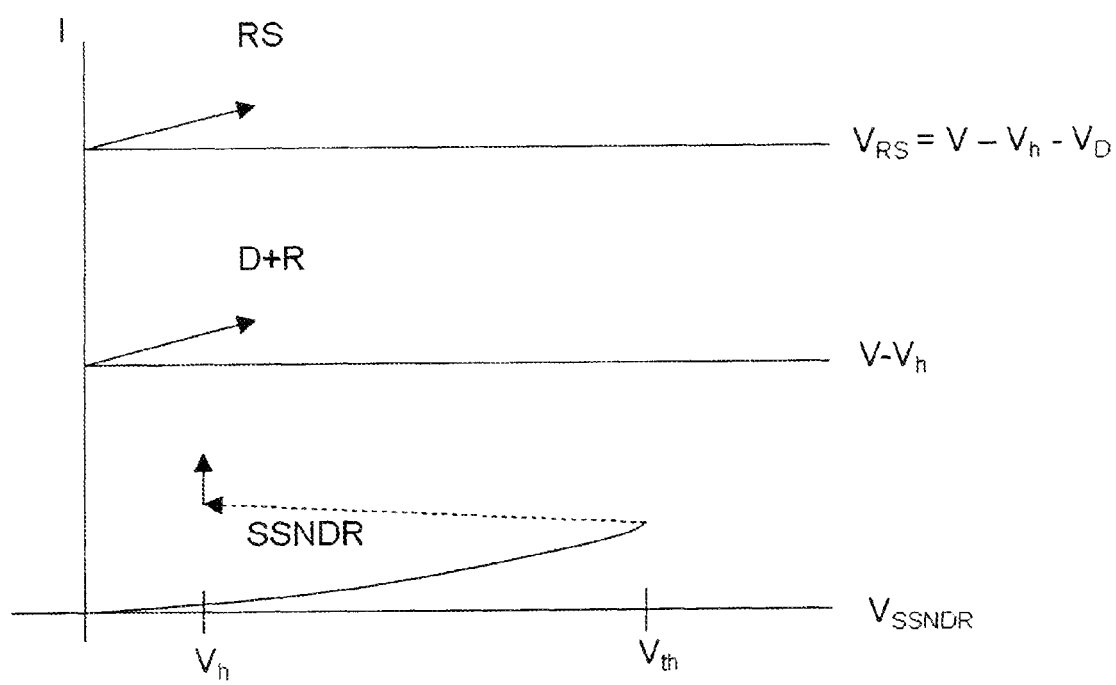
Figure 5C:
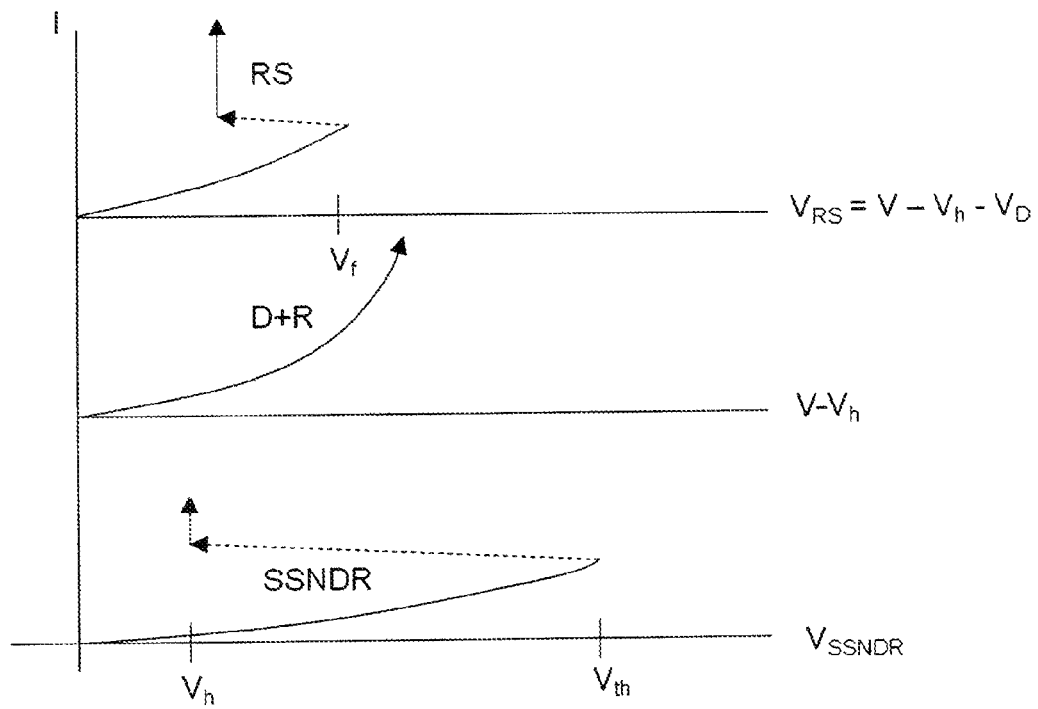

Among these figures, FIGS. 5(A)-5(C) show the curves during a Forming operation, where the initially insulating memory material is converted to a resistive switching state, by a means similar to soft breakdown. When the voltage V applied to the memory cell increases since the SSNDR device is initially in the OFF state, almost all of the voltage is apportioned to the SSNDR device due to its resistance being much larger than that of the resistive switching device and the diode, as shown in FIG. 5(A). Referring to FIG. 5(B), when V increases beyond $V_{th}$, $V_{SSNDR}$ drops to $V_h$, and is clamped at this value. This sudden reduction in voltage, or so-called 'snap-back,' is indicated by the dashed line. The rest of the applied voltage V–$V_h$ is apportioned to the diode and the resistive switching device. The voltage applied to the resistive switching device $V_{RS}=V-V_h-V_D$. However, since the resistance of the resistive switching device is also much larger than that of the diode, most of V–$V_h$ is applied on the resistive switching device. Therefore, in FIG. 5(B), the I-V curve for the resistive switching device alone is almost identical to that for the diode and resistive switching device. FIG. 5(C) shows the situation when V further increases and $V_{RS}$ becomes larger than $V_f$. At this stage, since the resistance of the resistive switching device drops, the voltage applied thereto also drops. This is similar to the previous case for the SSNDR device in FIG. 5(B), except that the SSNDR device returns to its initial high-resistance state if the current is reduced below the holding level $I_h$. The remainder of V–$V_h$ is applied across the diode, which functions to limit the total current passing through the memory cell.

For a SET operation where the resistive switching device is caused to enter into a lower resistance state, the sequence is similar to that shown in FIGS. 5(A)-5(C).

Figure 5D:
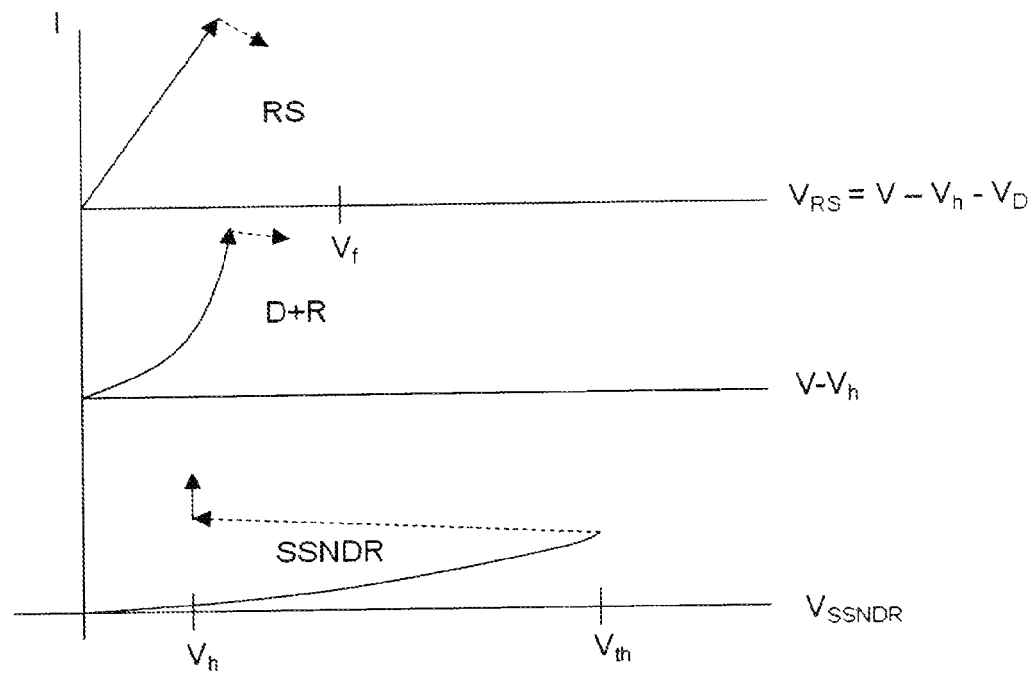

FIG. 5(D) schematically shows the I-V curves during a RESET operation, where the resistive switching device is caused to enter into a higher resistance state. For a RESET operation, after the SSNDR device is turned on, most voltage is apportioned to the diode. When the applied voltage is high enough that the current passing through the memory cell 110, that is, through the resistive switching device, reaches the current level previously used in the SET operation, the current will drop slightly.

Figure 5E:
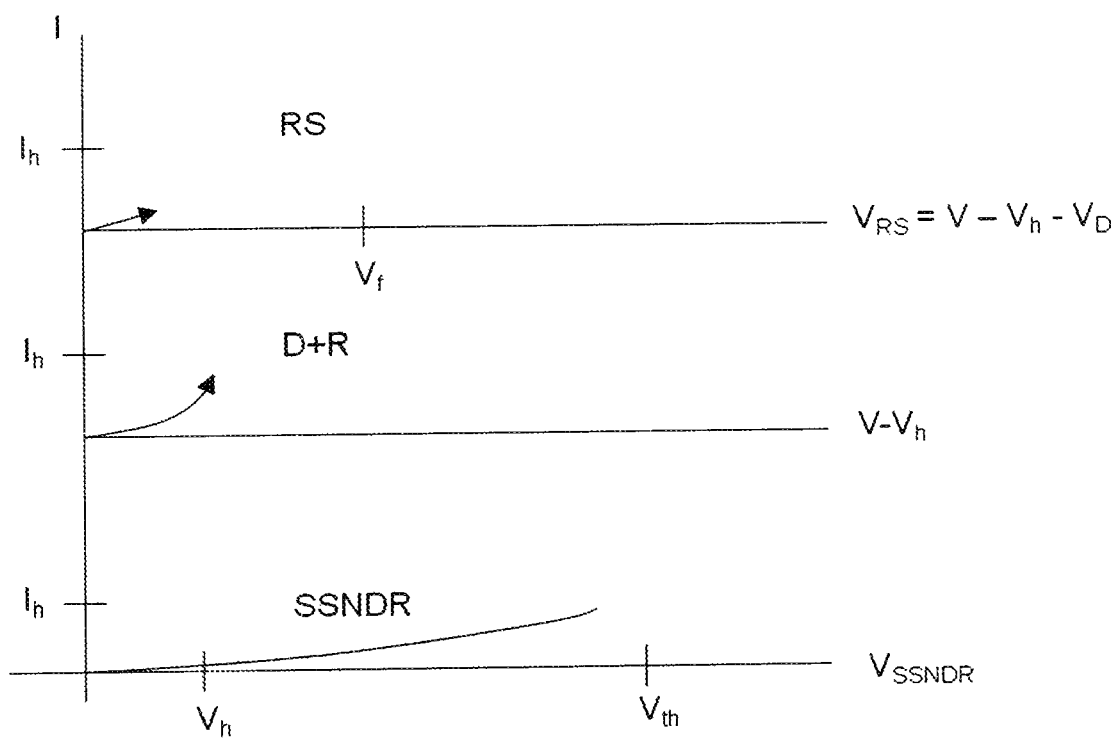

The resistance of the memory element 112 provided as a resistive switching device in a high-resistance state (HRS) may exceed about 10 M-ohm. In this situation, the current passing through the memory cell 110 may not exceed the holding current $I_h$ of the SSNDR device during a READ operation, as shown in FIG. 5(E). As such, the SSNDR device cannot remain in the ON state but stays in the OFF state. This improves the sensing margin, i.e., the ability to detect the high resistance and low resistance states as vastly different currents flowing from the cell.

Figure 8A:
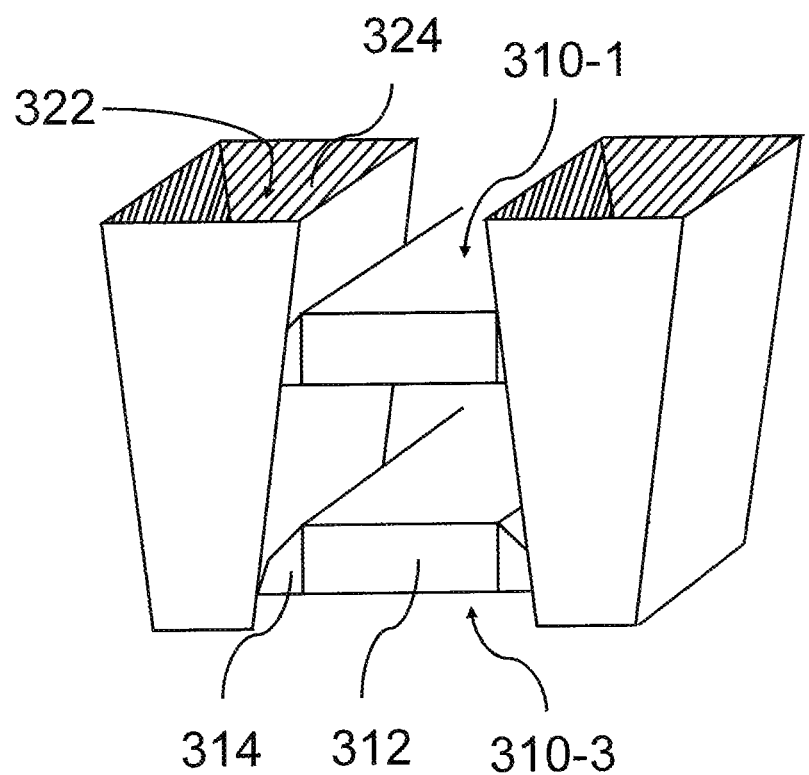
FIGS. 8(A) and 8(B) are schematic views showing the memory array after memory material is deposited according to an exemplary embodiment.
Figure 8B:
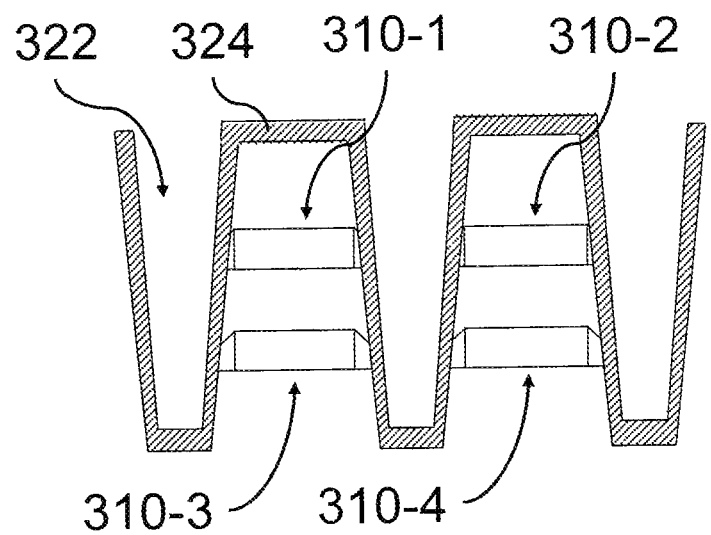
Figure 9A:
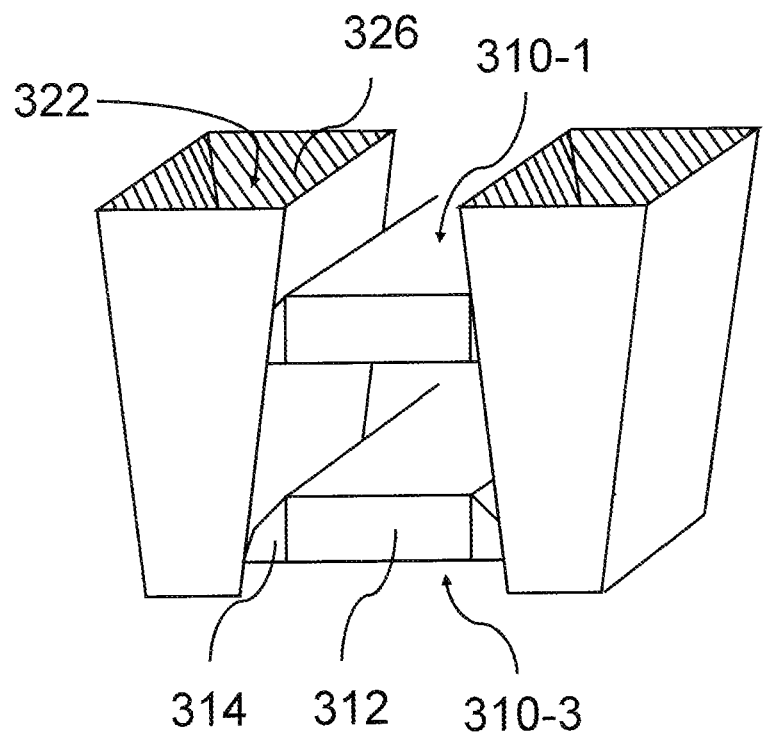
FIGS. 9(A) and 9(B) are schematic views showing the memory array after high-selection ratio material is deposited according to an exemplary embodiment.
Figure 9B:
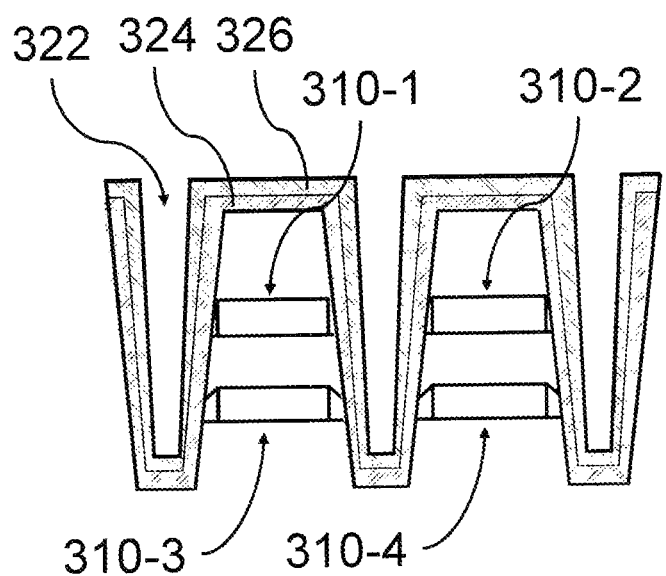
Figure 10A:
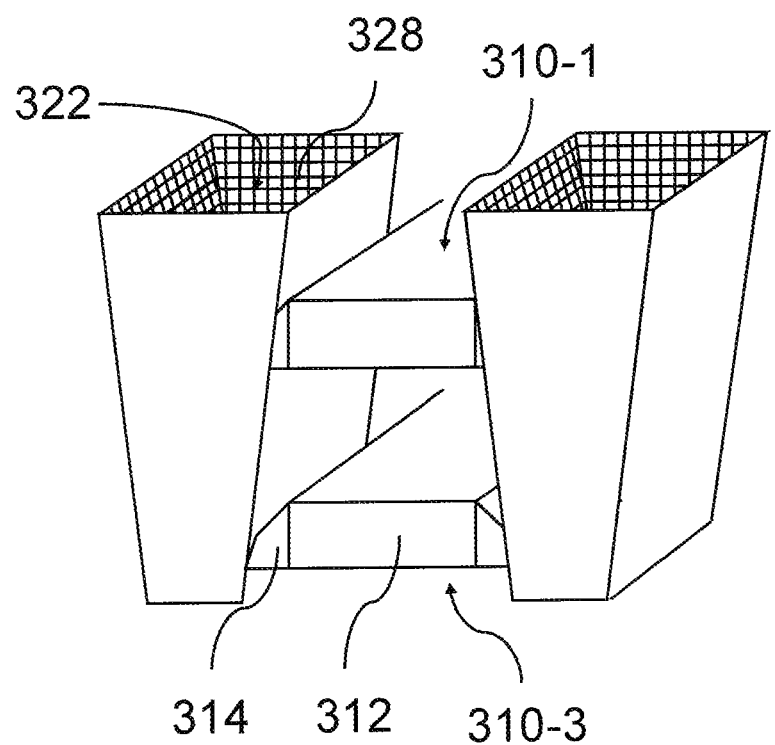
FIGS. 10(A) and 10(B) are schematic views showing the memory array after metal layer is deposited according to an exemplary embodiment.
Figure 10B:
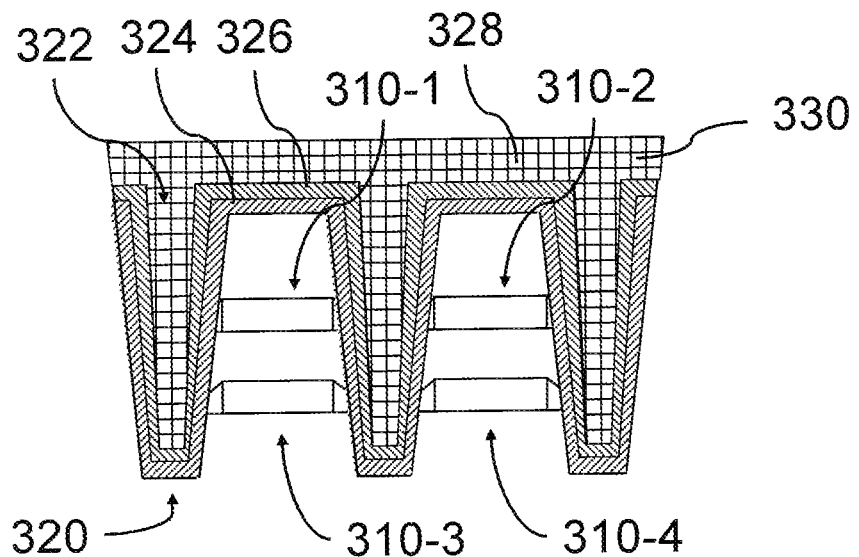

Embodiments consistent with the disclosure may also include a three-dimensional (3-D) memory array architecture. In some embodiments, each cell may be arranged at the intersection of a horizontal conducting line and a vertical conducting line. FIGS. 6(A)-10(B) schematically show the process of forming such a 3-D memory array architecture. FIGS. 6(A), 6(B), 7, 8(A), 9(A), and 10(A) are perspective views, and FIGS. 8(B), 9(B), and 10(B) are cross-sectional views. To facilitate explanation, major features are depicted in FIGS. 6(A)-10(B). Other features, such as dielectric layers formed between horizontal conducting lines, are not depicted.

Figure 6A:
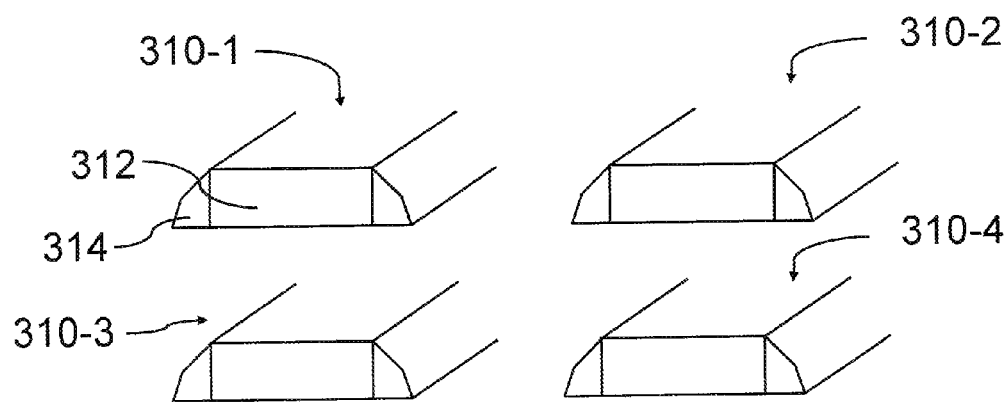
FIGS. 6(A) and 6(B) are schematic views showing two examples of planes of horizontal conducting lines according to an exemplary embodiment.
Figure 6B:
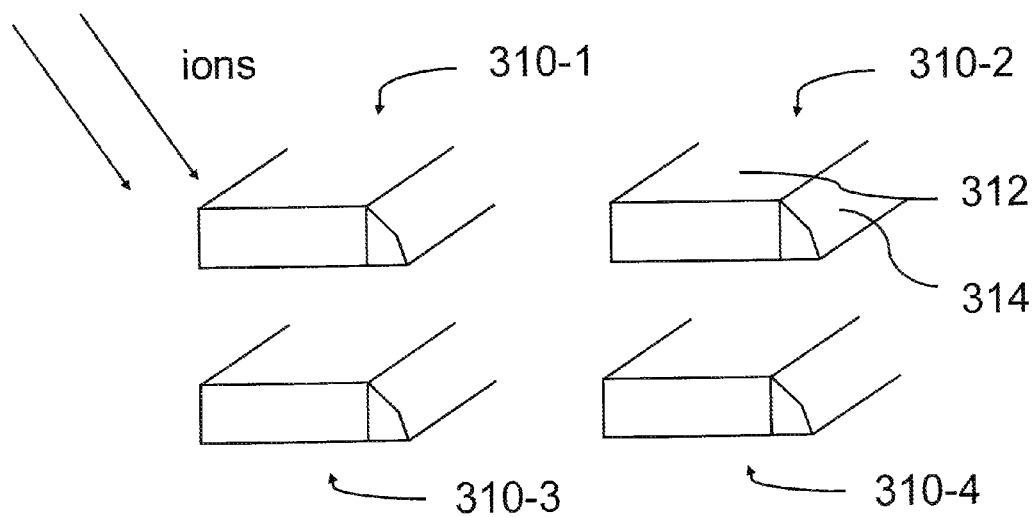

As shown in FIG. 6(A), horizontal conducting lines 310-1, 310-2, 310-3, and 310-4 are formed in multiple layers, where each layer may include an array of horizontal conducting lines. For example, horizontal conducting lines 310-1 and 310-2 are formed in one layer and have a same vertical position, and horizontal conducting lines 310-3 and 310-4 are formed in another layer and also have a same vertical position. Each of the horizontal conducting lines 310-1, 310-2, 310-3, and 310-4 includes a conductor 312 (e.g., TiN) acting as a word line, and a sidewall resistance material 314 (e.g., $TiO_x$) covering sidewalls of the conductor 312 to facilitate its action as a sidewall current limiter. The sidewall resistance material 314 may have a voltage-controlled resistance to facilitate its action as a current limiter. The sidewall resistance material 314 may be formed, e.g., by first depositing a $TiO_x$ layer over TiN conductor 312, and then etching back to remove the horizontal portions of the $TiO_x$ layer, leaving the $TiO_x$ on the sidewalls of the TiN conductor 312 as spacers. The sidewall resistance material 314 may extend in the horizontal direction for about 3 nm. In an alternative exemplary embodiment, the sidewall resistance material 314 on one side of the conductor 312 may be removed by ion sputtering or etching, as shown in FIG. 6(B). By etching the sidewall resistance material on one side, the horizontal lines 310-1-310-4 may be formed closer to their neighboring horizontal lines without resulting in a short circuit between neighboring lines, so as to increase storage density.

Figure 7:
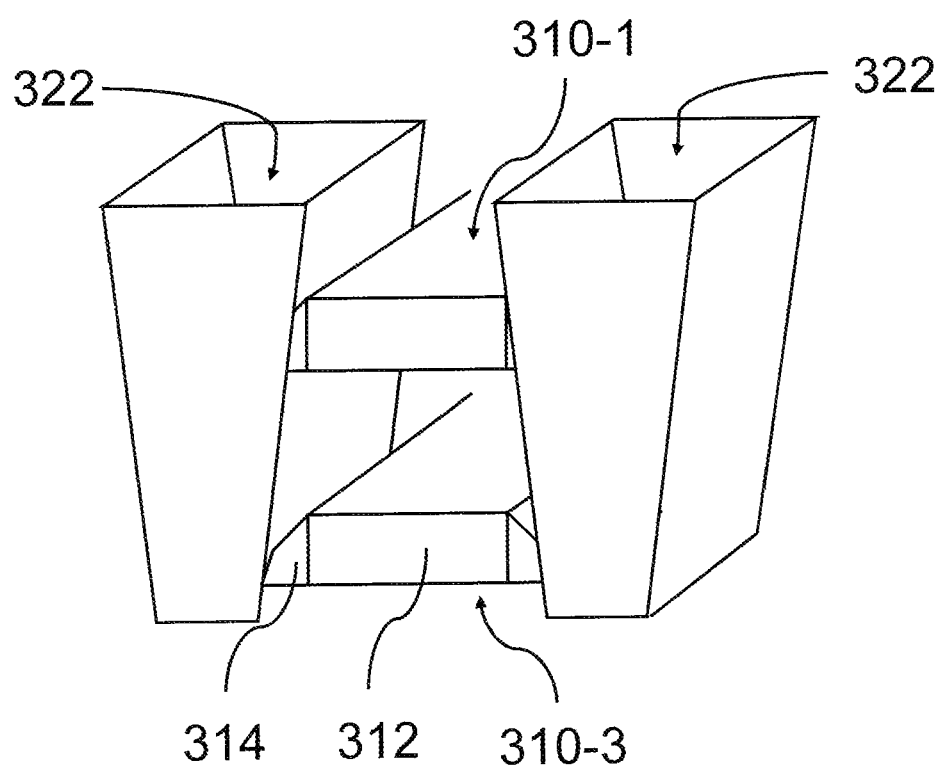
FIG. 7 is a schematic views showing a memory array after vias are formed according to an exemplary embodiment.
Figure 11:
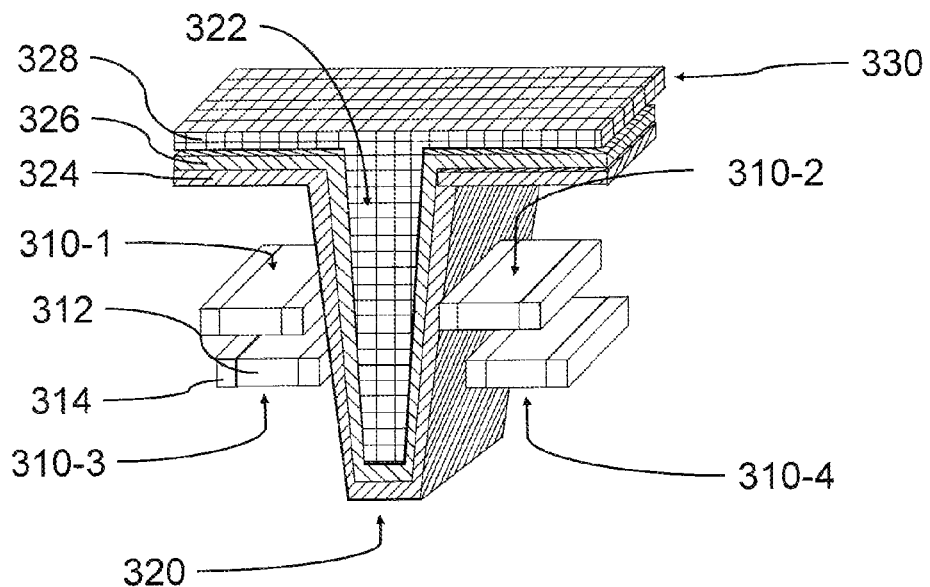
FIG. 11 is a schematic perspective view showing the memory array according to an exemplary embodiment.

As shown in FIG. 7, vias 322 are formed, exposing side surfaces of the horizontal conducting lines 310, e.g., lines 310-1 and 310-3. With reference to FIGS. 8(A) and 8(B), a memory material 324 (e.g., $HfO_2$ having a thickness of about 3 nm) is deposited on side surfaces within each via 322. With reference to FIGS. 9(A) and 9(B), a layer of high-selection ratio material 326 (e.g., SSNDR material, such as $NbO_x$ having a thickness of about 3 nm) is deposited on memory material 324 on side surfaces of each via 322. Next, with reference to FIGS. 10(A) and 10(B), a layer of a metal material 328, such as tungsten having a thickness of 3 nm is deposited on SSNDR material 326. Vertical conducting lines 320 are formed by the memory material 324, the SSNDR material 326, and the metal material 328 deposited in each of the vias 322, and connected to a bit line 330 formed by the metal material 328 deposited outside the vias 322 and extending in a horizontal direction orthogonal to the horizontal conducting lines 310-1, 310-2, 310-3, and 310-4. Respective sides of each of the vertical conducting lines 320 are connected with adjacent ones of the horizontal conducting lines 310-1-310-4 through the sidewall resistance material 314. In the overall architecture, the vias 322 may be formed at the same time as forming line-shaped trenches. With reference to FIG. 11, the depositions of layers 324, 326, and 328 may then fill both the vias and the trenches simultaneously. The metal material 328 deposited in the trench may serve as the bit line 330, as schematically shown in FIG. 11 (sidewalls of the trench are not shown in FIG. 11). The horizontal conducting lines 310-1, 310-2, 310-3, and 310-4 may be connected to wirings formed on the substrate using via accesses (not shown).

Figure 12:
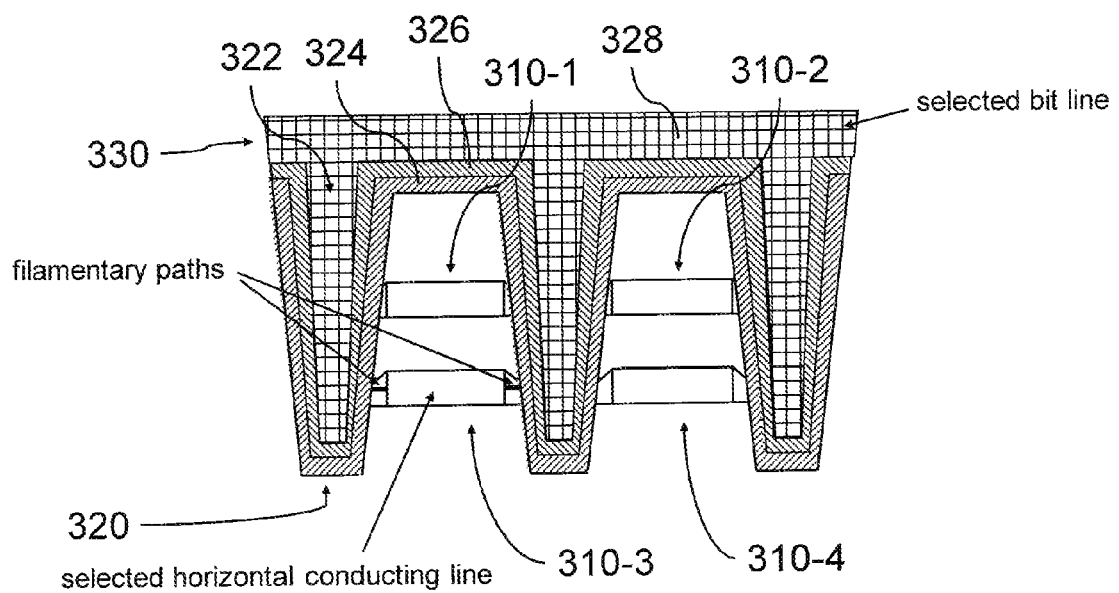
FIG. 12 is a schematic cross-sectional view showing filamentary paths formed in a memory array according to an exemplary embodiment.

Due to the filamentary nature of RRAM conduction, the overlap area of each vertical conducting line 320 with corresponding horizontal conducting lines 310-1-310-4 is not critical. When both sidewalls of a horizontal conducting line are covered by the sidewall resistance material, two filamentary paths may be formed between a selected horizontal conducting line and a selected bit line, such as shown in FIG. 12.

Figure 13:
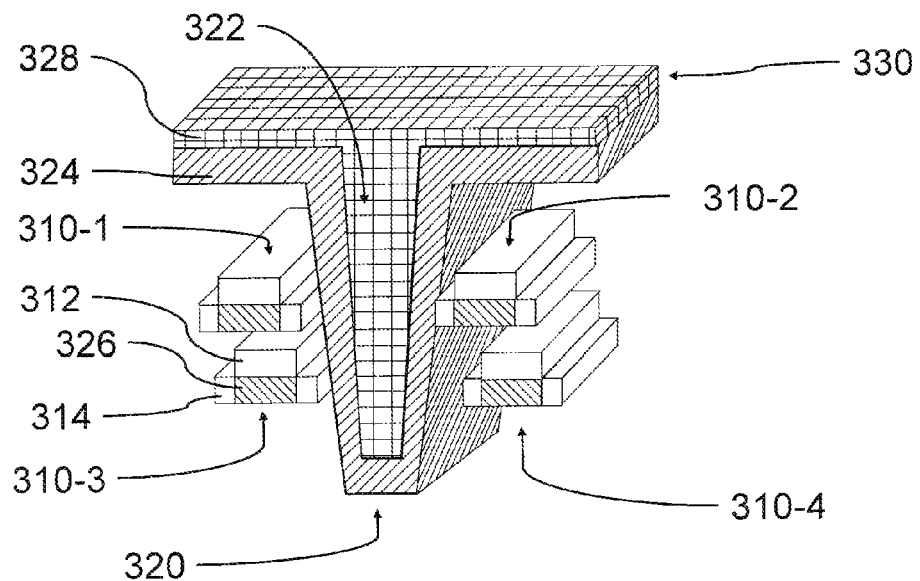
FIG. 13 is a schematic perspective view showing a memory array according to another exemplary embodiment.
Figure 14:
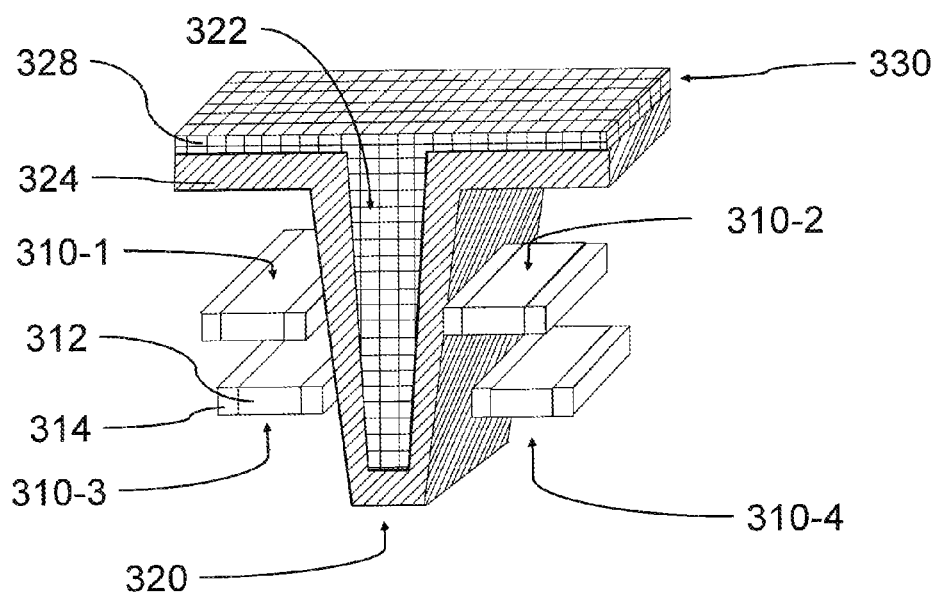
FIG. 14 is a schematic perspective view showing a memory array according to yet another exemplary embodiment.

FIG. 13 shows an alternative embodiment, in which the high-selection ratio material is not deposited in the vias 322. In the embodiment shown in FIG. 13, the high selection ratio material 326 is formed as part of the horizontal conducting lines. The sidewall resistance material 314 is formed on the sidewalls of the high selection ratio material 326, and the conductor 312 is formed on top of the high selection ratio material 326. This embodiment may allow for a higher density. Additionally, if there is no need for random access, a row-based access, where an entire row is read or RESET at the same time, may be employed. For such an access, as schematically shown in FIG. 14, the high-selection ratio material 326 may be omitted. It may also be possible that the sidewall resistance material 314 serves as the high-selection ratio material. The sidewall resistance material 314 may then be formed on the sidewalls of the conductor 312 and intersect the memory material 324 in the via 322.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A memory cell comprising:
   a memory element to store data as a resistance state;
   a current-limiting element electrically coupled to the memory element, the current-limiting element being a voltage-controlled resistor (VCR) having a resistance that decreases when a voltage applied thereto increases; and
   a high-selection-ratio element electrically coupled to the memory element, the high-selection-ratio element having a first resistance when a voltage applied to the memory cell is approximately equal to a selection voltage of the memory cell and having a second resistance that is substantially larger than the first resistance when the voltage applied to the memory cell is approximately equal to one-half of the selection voltage.

2. The memory cell of claim 1, wherein the memory element, the high-selection-ratio element, and the current-limiting element are vertically stacked one on another, and are electrically coupled in series.

3. The memory cell of claim 1, wherein the high-selection-ratio element includes an S-shaped negative differential resistance (SSNDR) characteristic device.

4. The memory cell of claim 3, wherein the memory element, the SSNDR device, and the VCR are vertically stacked one on another, and are electrically coupled in series.

5. The memory cell of claim 4, wherein the VCR is selected so that when a voltage applied to the memory cell is approximately equal to a selection voltage of the memory cell, a current passing through the memory cell is larger than a holding current of the SSNDR device but has a density smaller than about 10 $MA/cm^2$.

6. The memory cell of claim 5, wherein the holding current of the SSNDR device has a density of about 10 $kA/cm^2$.

7. The memory cell of claim 3, wherein the SSNDR device is an ovonic threshold switch (OTS).

8. The memory cell of claim 7, wherein a material for the OTS includes at least one of S, Se, or Te in combination with at least one of Ge, As, N, P, or Si.

9. The memory cell of claim 7, wherein a thickness of the OTS is about 10 nm or less.

10. The memory cell of claim 3, wherein the SSNDR device comprises a tunneling barrier layer and a layer supporting a locally variable charge density.

11. The memory cell of claim 3, wherein the SSNDR device comprises a layer supporting a locally variable charge density, sandwiched between two tunneling barrier layers.

12. The memory cell of claim 3, wherein the SSNDR device comprises a material that undergoes a metal-insulator transition.

13. The memory cell of claim 3, wherein the SSNDR device comprises a thermistor.

14. The memory cell of claim 3, wherein the SSNDR device comprises an oxide layer.

15. The memory cell of claim 1, wherein the VCR includes a thermistor.

16. The memory cell of claim 1, wherein the VCR includes a space-charge-limited current conductor.

17. The memory cell of claim 1, wherein the VCR comprises a mixed ionic-electronic conductor (MIEC).

18. The memory cell of claim 1,
   wherein a ratio of the second resistance of the high-selection-ratio element to the first resistance of the high-selection-ratio element is larger than about $5 \times 10^5$.

19. The memory cell of claim 18, wherein a ratio of the second resistance of the high-selection-ratio element to a resistance of the memory element when in a high-resistance state is larger than about $10^6$.

20. The memory cell of claim 1, wherein the VCR includes a first TiN layer, a $TiO_x$ ($0<x\leq2$) layer stacked on the first TiN layer, and a second TiN layer stacked on the $TiO_x$ layer.

21. The memory cell of claim 20, wherein the $TiO_x$ layer is a $TiO_2$ layer.

22. The memory cell of claim 20, wherein a thickness of the $TiO_x$ layer is about 5-20 nm and a thickness of each of the first and second TiN layers is about 10-40 nm.

* * * * *